United States Patent
Cho et al.

(10) Patent No.: US 9,734,904 B1
(45) Date of Patent: Aug. 15, 2017

(54) DIGITAL LOW DROP-OUT REGULATOR AND RESISTIVE MEMORY DEVICE USING THE SAME

(71) Applicants: SK hynix Inc., Icheon (KR); Korea Advanced Institute of Science and Technology, Daejeon (KR)

(72) Inventors: Gyu Hyeong Cho, Daejeon (KR); Sung Won Choi, Daegu (KR); Chang Yong Ahn, Seoul (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/423,456

(22) Filed: Feb. 2, 2017

(30) Foreign Application Priority Data

Nov. 22, 2016 (KR) .......................... 10-2016-0155421

(51) Int. Cl.
   *G11C 13/00* (2006.01)
   *G05F 3/26* (2006.01)
(52) U.S. Cl.
   CPC .......... *G11C 13/0038* (2013.01); *G05F 3/262* (2013.01); *G11C 13/004* (2013.01); *G11C 13/0069* (2013.01); *G11C 13/0021* (2013.01)
(58) Field of Classification Search
   CPC .............. G11C 13/0038; G11C 13/004; G11C 13/0069; G11C 13/0021; G05F 3/262;
   (Continued)

(56) References Cited

U.S. PATENT DOCUMENTS

| | | | |
|---|---|---|---|
| 2015/0061621 A1* | 3/2015 | Pons ....................... | G05F 1/575 323/280 |
| 2015/0130427 A1* | 5/2015 | Chou ....................... | G05F 1/46 323/269 |

(Continued)

FOREIGN PATENT DOCUMENTS

WO    WO 2015/017236 A1    2/2015

OTHER PUBLICATIONS

Yong-Jin Lee, et al., "A 200mA Digital Low-Drop-Out Regulator with Coarse-Fine Dual Loop in Mobile Application Processors", IEEE International Solid-State Circuits Conference (ISSCC), Feb. 2, 2016, pp. 150-152, IEEE.

(Continued)

*Primary Examiner* — Tan T. Nguyen (57) ABSTRACT

A digital LDO regulator includes a first comparison circuit to compare an output voltage with a reference voltage and to output a reference load switching signal when the output voltage rises above the reference voltage, a logic circuit to output a control current in response to the reference load switching signal, a second comparison circuit to compare the output voltage with a transient reference voltage and to output a transient load switching signal when the output voltage rises above the transient reference voltage, a switching circuit to control the logic circuit to pass a transient current in response to the transient load switching signal, a circuit to provide a mirroring current to the logic circuit after a transient state, a load current supply circuit to switch in response to the control current and to supply a load current, and a capacitor coupled to the load current supply circuit.

18 Claims, 11 Drawing Sheets

(58) Field of Classification Search
CPC . G05F 1/56; G05F 1/565; G05F 1/575; G01F 1/59; H03F 1/26; H03F 3/40576
USPC .............. 365/148, 158, 163, 189.09, 189.11; 323/241, 281, 282, 283
See application file for complete search history.

(56) References Cited

U.S. PATENT DOCUMENTS

| | | | |
|---|---|---|---|
| 2015/0185747 A1* | 7/2015 | Liu ........................ | G05F 1/565 323/268 |
| 2015/0198960 A1* | 7/2015 | Zhang ...................... | G05F 1/56 323/280 |
| 2015/0220096 A1* | 8/2015 | Luff ..................... | G02F 1/1368 327/109 |
| 2016/0231761 A1* | 8/2016 | Jain .......................... | G05F 1/56 |
| 2016/0308497 A1* | 10/2016 | Park ......................... | H03F 1/26 |
| 2017/0017250 A1* | 1/2017 | Peluso ................... | G05F 1/575 |

OTHER PUBLICATIONS

Yasuyuki Okuma et al., "0.5-V Input Digital LDO with 98.7% Current Efficiency and 2.7-μA Quiescent Current in 65nm CMOS", Custom Integrated Circuits Conference (CICC), 2010, pp. 1-4, IEEE.

* cited by examiner

【Fig. 1】

PRIOR ART

[Fig. 2A]

PRIOR ART

[Fig. 2B]

PRIOR ART

[Fig. 3A]

PRIOR ART

[Fig. 3B]

PRIOR ART

DIGITAL LOW DROP-OUT REGULATOR AND RESISTIVE MEMORY DEVICE USING THE SAME

CROSS-REFERENCE TO RELATED APPLICATIONS

The present application claims priority to Korean Patent Application No. 10-2016-0155421, filed on Nov. 22, 2016, which is incorporated herein by reference in its entirety.

BACKGROUND

1. Field

Embodiments of the present disclosure relate to a digital LDO (Low Drop-Out) regulator and a resistive memory device using the same, and more particularly, to a digital LDO regulator, which is capable of rapidly responding to a peak load current variation and handling a characteristic change of a resistive memory cell, and a resistive memory device using the same.

2. Description of the Related Art

Recently, the integration of circuits with various functions in one chip has required an efficient and stable supply voltage management system.

In particular, a supply voltage required for a core processor system may have a different level depending on a type of a driving operation. That is, since the driving operation of the core processor system may be divided into a plurality of sub-operations corresponding to various commands and a supply voltage may have a different level depending on a command, a supply voltage having a different level needs to be supplied at a high speed when a command is changed to another command. Thus, research has been actively conducted to develop a supply voltage management system that rapidly generates various supply voltages required for the core processor system.

Since a switching regulator uses an inductor, the switching regulator can generate supply voltages having different levels while having excellent power efficiency. However, a generation speed of the supply voltages is low. An LDO regulator can rapidly generate a supply voltage. However, the LDO regulator cannot generate a higher voltage than a given voltage and has low power efficiency. Thus, when the switching regulator is used to generate supply voltages having different levels and the LDO regulator is used to manage the supply voltages at a high speed, supply voltages required for a core processor system can be rapidly and stably supplied.

A core processor supply voltage management system causes a difference in generation speeds of supply voltages, depending on an operation type of an LDO regulator.

Figure 1:
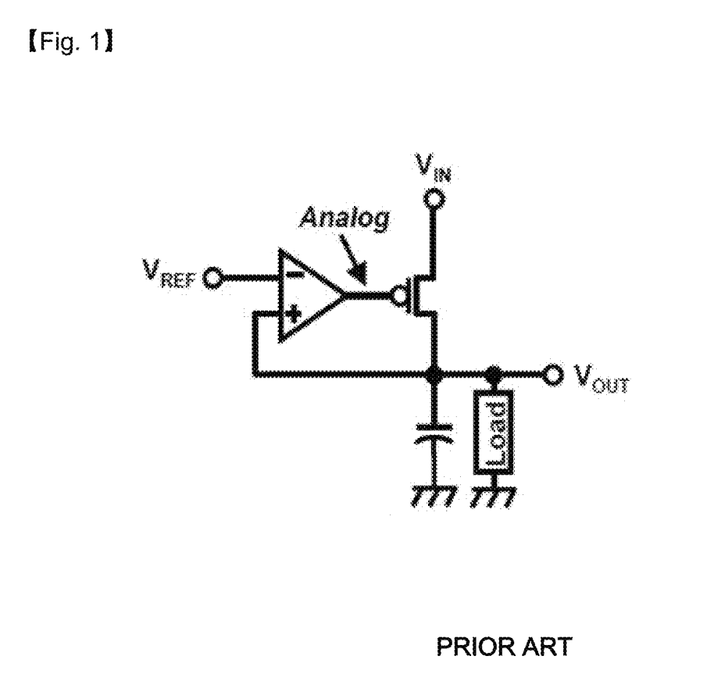
FIG. 1 is a circuit diagram of a conventional analog LDO regulator.

FIG. 1 illustrates a conventional analog LDO regulator. Since the LDO regulator uses an amplifier, a characteristic of the LDO regulator is inevitably degraded unless the LDO regulator performs a precise process. Furthermore, a supply voltage cannot be lowered using the conventional analog LDO regulator, and thus a high bandwidth must be set for a high-speed operation.

Figure 2A:
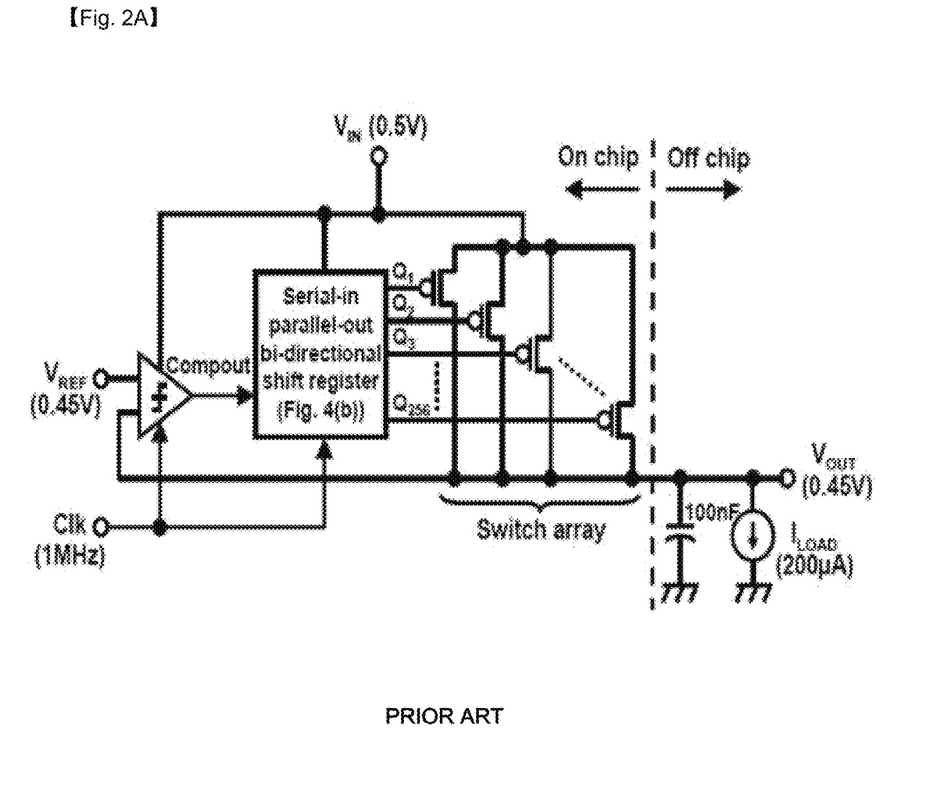
FIG. 2A is a circuit diagram of a conventional digital LDO regulator.

FIG. 2A illustrates a conventional digital LDO regulator that does not include an amplifier. Instead, the conventional digital LDO regulator includes a controller and a main switching unit. The controller includes a comparator and a shift register. The main switching unit supplies a load current and includes a plurality of small transistors.

Figure 2B:
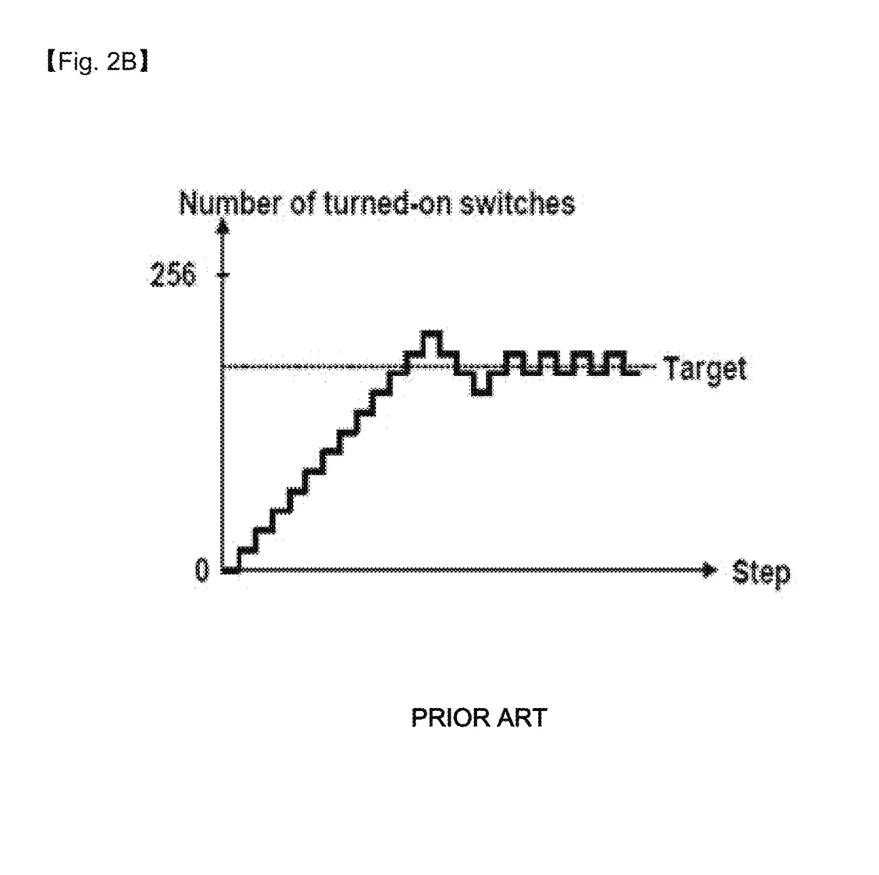
FIG. 2B is a waveform diagram illustrating a load voltage of the conventional digital LDO regulator of FIG. 2A.

The conventional digital LDO regulator of FIG. 2A has a smaller output ripple than a digital LDO regulator using only a comparator. As illustrated in FIG. 2B, an output of the conventional digital LDO regulator reaches a target voltage over a plurality of steps. Thus, when the load current varies, a fluctuation of a load voltage is recovered at a low speed.

Figure 3A:
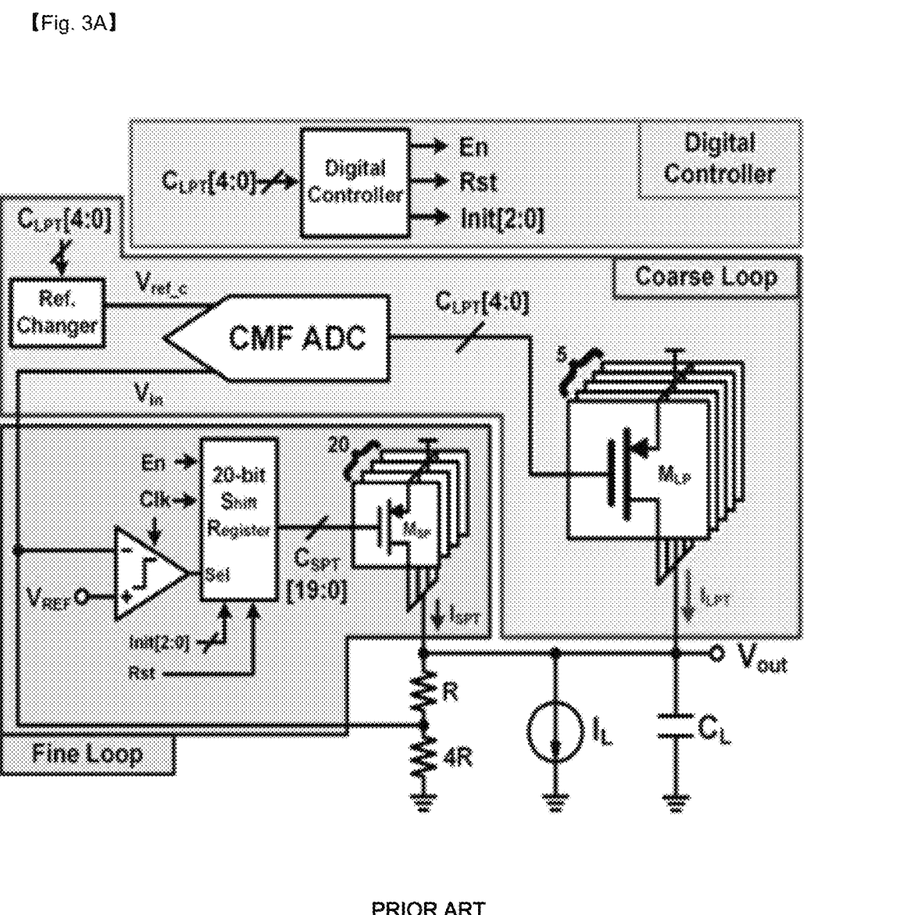
FIG. 3A is a circuit diagram of another conventional digital LDO regulator.
Figure 3B:
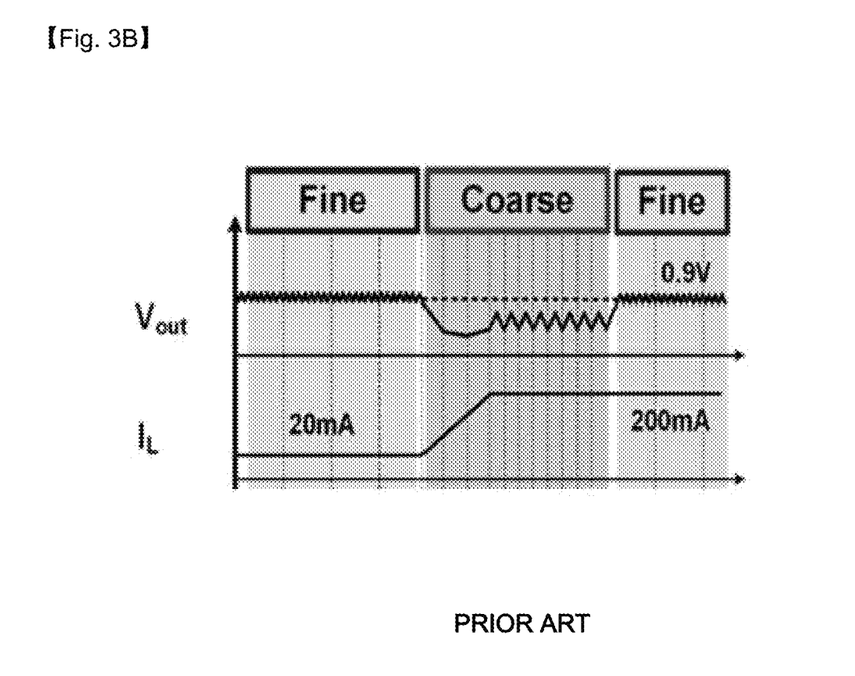
FIG. 3B is a waveform diagram illustrating a load voltage of the conventional digital LDO regulator of FIG. 3A.

FIG. 3A illustrates another conventional digital LDO regulator, which includes a switching unit for supplying a load current. The switching unit includes a high-current transistor and a low-current transistor. As illustrated in FIG. 3B, the conventional digital LDO regulator of FIG. 3A controls a transient situation using the high-current transistor when the load current varies, and controls a situation following the transient situation using the low-current transistor, thereby minimizing a ripple. However, such a configuration may cause a time delay while an operation is performed by switching from the high-current transistor to the low-current transistor, and may also have a limitation in shortening the time delay.

SUMMARY

Various embodiments are directed to a digital LDO regulator, which employs a push-pull scheme and rapidly responds to a peak load current variation while occupying a small area, thereby improving a transient characteristic, and a resistive memory device using the same.

Also, various embodiments are directed to a digital LDO regulator, which employs a calibration circuit and adjusts a recovery speed of a load current in response to a characteristic change of a resistive memory cell, and a resistive memory device using the same.

In an embodiment, a digital LDO (Low Drop-Out) regulator may include: a reference voltage comparison circuit configured to compare an output voltage to a reference voltage having a first level, and to output a reference load switching signal when the output voltage rises above the reference voltage; a push-pull logic circuit configured to output a control current in a push-pull manner in response to the reference load switching signal; a transient load voltage comparison circuit configured to compare the output voltage to a transient reference voltage having a second level, and to output a transient load switching signal when the output voltage rises above the transient reference voltage; a transient current switching circuit configured to perform a switching operation in response to the transient load switching signal, the switching operation controlling the push-pull logic circuit to pass a transient current; a current mirroring circuit configured to provide a mirroring current to the push-pull logic circuit after a transient state; a load current supply circuit configured to switch in response to the control current outputted from the push-pull logic circuit, and to supply a load current; and a capacitor coupled in parallel to a control terminal of the load current supply circuit.

In an embodiment, there is provided a read/write driver including the digital LDO regulator. In an embodiment, there is provided a resistive memory device comprising a read/write driver including the digital LDO regulator.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
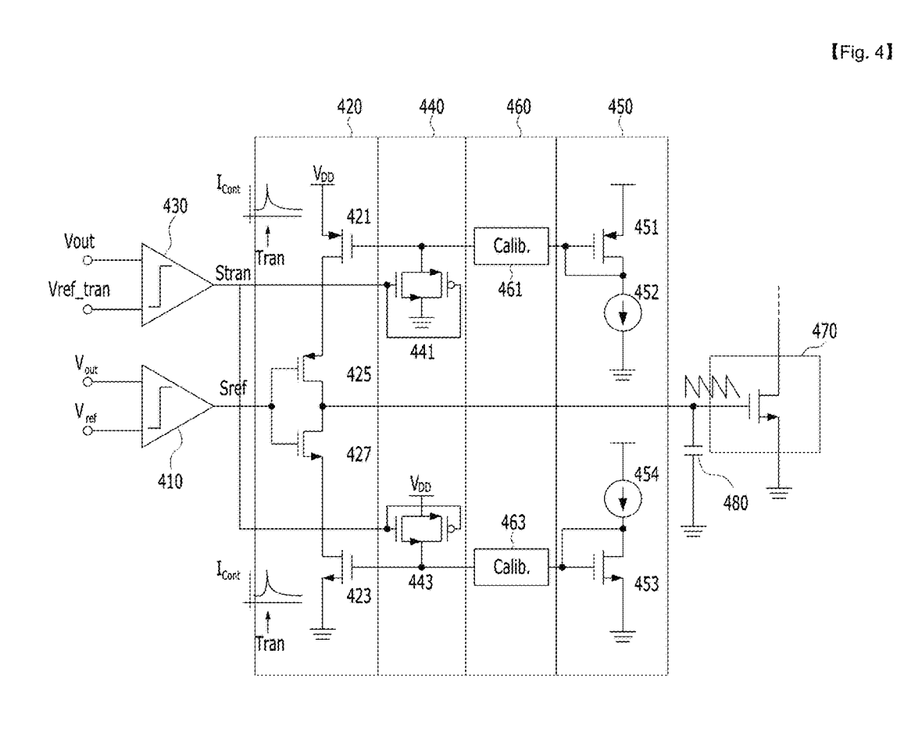
FIG. 4 is a circuit diagram of a digital LDO regulator according to an embodiment.

FIG. 4 is a circuit diagram of a digital LDO regulator according to an embodiment.

The digital LDO regulator according to the present embodiment includes a reference voltage comparison circuit 410, a push-pull logic circuit 420, a transient load voltage comparison circuit 430, a transient current switching circuit 440, a current mirroring circuit 450, a current calibration circuit 460, a load current supply circuit 470, and a capacitor 480.

The reference voltage comparison circuit 410 compares an output voltage Vout to a reference voltage Vref, and outputs a reference load switching signal Sref when the output voltage Vout rises above the reference voltage Vref. Vref may have a first level.

The push-pull logic circuit 420 is controlled by the reference load switching signal Sref, and outputs a control current in a push-pull manner. The push-pull logic circuit 420 includes a push transistor 421, a pull transistor 423, a first switching element 425, and a second switching element 427. The push transistor 421 is coupled to a supply voltage terminal VDD and outputs a push control current. The pull transistor 423 is coupled to a ground voltage terminal and outputs a pull control current. The first switching element 425 is positioned between the push transistor 421 and a control terminal of the load current supply circuit 470, and supplies the push control current to the load current supply circuit 470 through the control terminal. The second switching element 427 is positioned between the pull transistor 423 and the control terminal of the load current supply circuit 470, and supplies the pull control current to the load current supply circuit 470 through the control terminal. In the embodiment shown in FIG. 4, the push transistor 421 is a PMOS transistor, the pull transistor 423 is an NMOS transistor, the first switching element 425 is a PMOS transistor, and the second switching element 427 is an NMOS transistor.

The transient load voltage comparison circuit 430 compares the output voltage Vout to a transient reference voltage Vref_tran having a second level that is higher than the first level, and outputs a transient load switching signal Stran when the output voltage Vout rises above the transient reference voltage Vref_tran.

The transient current switching circuit 440 controls the push-pull logic circuit 420 to pass a transient current, e.g., a high transient current, using control switches 441 and 443 that operate in response to the transient load switching signal Stran. Specifically, when the upper control switch 441 is turned on by the transient load switching signal Stran, a gate voltage of the push transistor 421 reaches a ground potential. Thus, the transient current flows through the push transistor 421. Similarly, when the lower control switch 443 is turned on by the transient load switching signal Stran, a gate voltage of the pull transistor 423 reaches a supply voltage. Thus, the transient current flows through the pull transistor 423.

The current mirroring circuit 450 provides a mirroring current to the push-pull logic circuit 420 after a transient state. The transient state represents a state that the transient current flows through the push transistor 421 or the pull transistor 423. The current mirroring circuit 450 includes a first-type transistor 451, a first current source 452, a second-type transistor 453, and a second current source 454. The first-type transistor 451 is coupled to the supply voltage terminal VDD and generates a push-type mirror current. The first current source 452 is positioned between the first-type transistor 451 and the ground voltage terminal. The second-type transistor 453 is coupled to the ground voltage terminal and generates a pull-type mirror current. The second current source 454 is positioned between the second-type transistor 453 and the supply voltage terminal VDD. In the embodiment shown in FIG. 4, the first-type transistor 451 is a PMOS transistor, and the second-type transistor 453 is an NMOS transistor.

The current calibration circuit 460 is positioned between the push-pull logic circuit 420 and the current mirroring circuit 450, and calibrates a mirroring current flowing through the push-pull logic circuit 420. The current calibration circuit 460 includes a first current calibration unit 461 and a second current calibration unit 463. The first current calibration unit 461 is disposed between a gate terminal of the push transistor 421 of the push-pull logic circuit 420 and a gate terminal of the first-type transistor 451 of the current mirroring circuit 450. The second current calibration unit 463 is disposed between a gate terminal of the pull transistor 423 of the push-pull logic circuit 420 and a gate terminal of the second-type transistor 453 of the current mirroring circuit 450.

The load current supply circuit 470 switches in response to the control current outputted from the push-pull logic circuit 420, and supplies a load current.

According to the present embodiment, the control terminal of the load current supply circuit 470 is coupled in parallel to a capacitor 480. In the embodiment shown in FIG. 4, the load current supply circuit 470 includes a transistor, which is disposed between an output terminal and the ground voltage terminal and has a gate terminal corresponding to the control terminal. The load current may be supplied through the output terminal of the load current supply circuit 470. In an embodiment, the transistor of the load current supply circuit 470 is an NMOS transistor.

The digital LDO regulator according to the present embodiment is used for controlling a negative (−) voltage. A current waveform illustrated in the push-pull logic circuit 420 of FIG. 4 shows that the control current having a negative value decreases in the transient state.

Figure 5:
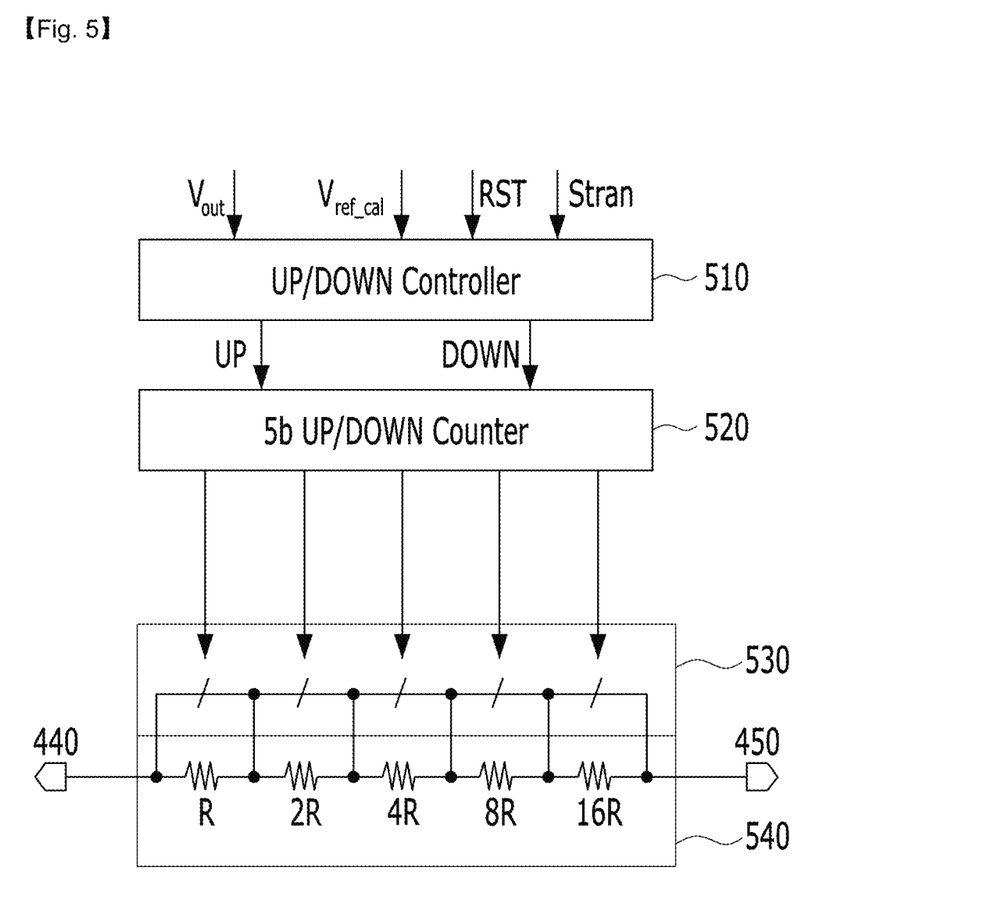
FIG. 5 is a circuit diagram of a current calibration unit shown in FIG. 4 according to an embodiment.

FIG. 5 is a circuit diagram of a current calibration unit according to an embodiment. The current calibration unit of FIG. 5 may correspond to each of the first and second current calibration units 461 and 463 shown in FIG. 4.

The current calibration unit according to the present embodiment can minimize a variation of a load current that is generated while the load current transitions from the transient state to a steady state. That is, when the load current which rapidly rose in the transient state is rapidly lowered, a problem such as undershoot may occur. To avoid the problem, the load current needs to be slowly lowered.

For this operation, the current calibration unit according to the present embodiment includes an up/down controller 510, an up/down counter 520, a resistor selection switching unit 530, and a resistor string unit 540.

The up/down controller 510 compares the output voltage Vout and a calibration reference voltage Vref_cal, and outputs an up signal UP or a down signal DOWN using the transient load switching signal Stran and a calibration switching signal Scal outputted when the output voltage Vout is lower than the calibration reference voltage Vref_cal.

The up/down counter 520 outputs an up count signal or a down count signal in response to the up signal UP or the down signal DOWN output from the up/down controller 510.

The resistor selection switching unit 530 includes a plurality of switches that are controlled by the up or down count signal to select one or more resistors among a plurality of resistors in the resistor string unit 540. The plurality of resistors may have different sizes and may be coupled in series to each other. Each of the plurality of switches is coupled in parallel to a corresponding one of the plurality of resistors, thereby controlling a resistance value of the resistor string unit 540.

The resistor string unit 540 is coupled between the push-pull logic circuit 420 and the current mirror circuit 450 that are shown in FIG. 4.

Figure 6:
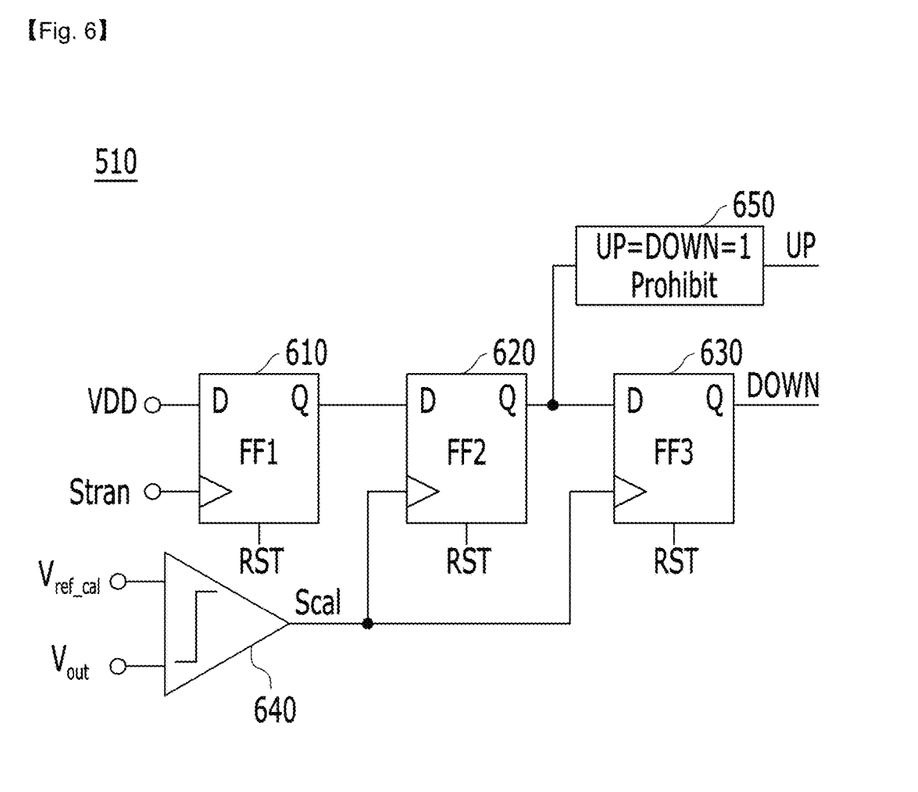
FIG. 6 is a circuit diagram of an up/down controller shown in FIG. 5 according to an embodiment.
Figure 7A:
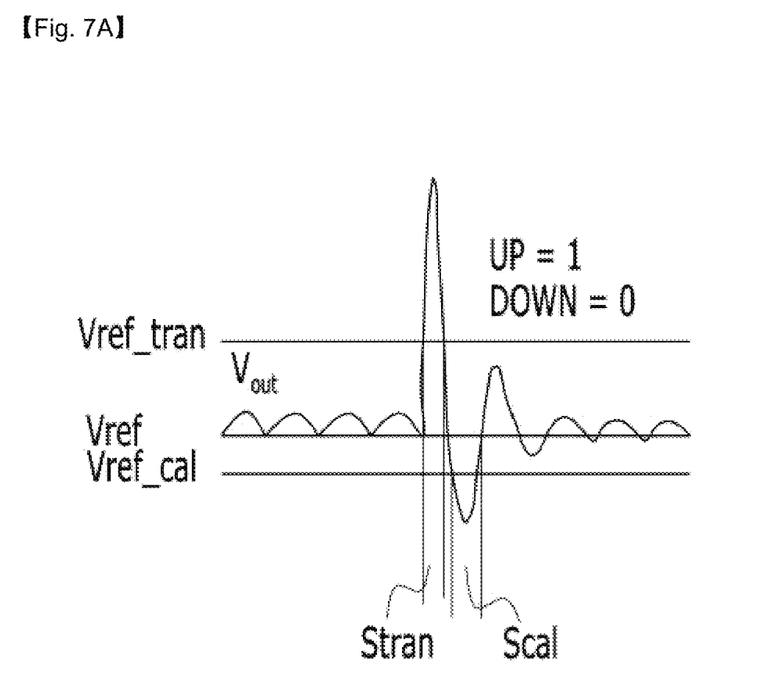
FIGS. 7A to 7C are output voltage waveform diagrams according to an embodiment.
Figure 7B:
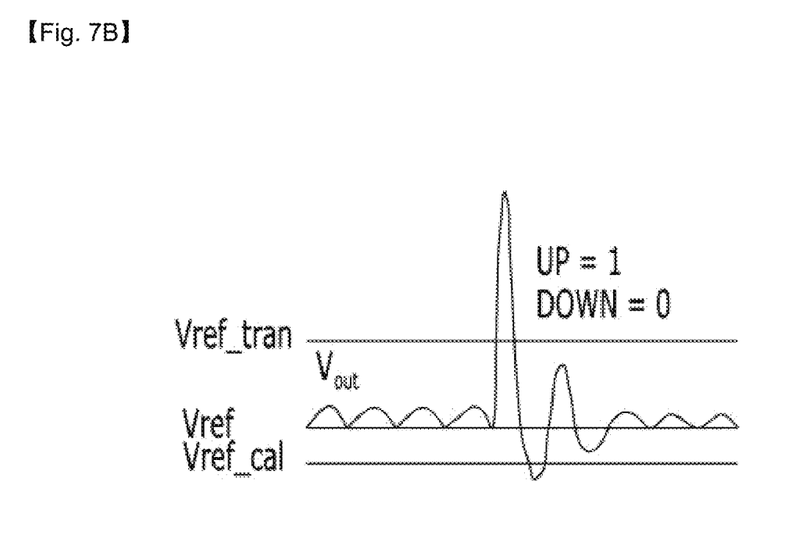

FIG. 6 is a circuit diagram of the up/down controller 510 shown in FIG. 5 according to an embodiment, and FIGS. 7A and 7B are output voltage waveform diagrams according to an embodiment.

The up/down controller 510 includes a calibration voltage comparator 640, first to third delay flip-flop (D F/F) 610 to 630, and a prohibitor 650.

The calibration voltage comparator 640 compares the output voltage Vout to the calibration reference voltage Vref_cal, and outputs the calibration switching signal Scal when the output voltage Vout is lower than the calibration reference voltage Vref_cal. Vref_cal has a third level that is lower than the first level of the reference voltage Vref.

The first D F/F 610 receives the supply voltage VDD and outputs an H-level signal when the transient load switching signal Stran is generated, the transient load switching signal Stran being inputted to the first D F/F 610 as a clock signal. The second D F/F 620 receives an output of the first D F/F 610 and outputs an H-level up signal UP when the first calibration switching signal Scal is generated. The third D F/F 630 receives an output of the second D F/F 620 and outputs an H-level down signal DOWN when the second calibration switching signal Scal is generated. The calibration switching signal Scal is inputted to the second D F/F 620 and the third D F/F 630 as a clock signal to control operations of the second D F/F 620 and the third D F/F 630. The second calibration switching signal Scal represents the calibration switching signal Scal that is generated by the calibration voltage comparator 640 after the first calibration switching signal Scal is generated.

When the H-level down signal DOWN is outputted from the third D F/F 630 while the H-level up signal UP is outputted from the second D F/F 620, the prohibitor 650 shifts the H-level up signal UP to an L-level. Thus, the prohibitor 650 prohibits the H-level up signal UP and the H-level down signal DOWN from being applied to the up/down counter 520 at the same time.

According to the present embodiment, whenever the H-level up signal UP is outputted from the up/down controller 510, the resistance value of the resistor string unit 540, in which the resistors having difference sizes are coupled in series, is increased by a switching operation of the resistor selection switching unit 530. Furthermore, when the H-level down signal DOWN is outputted from the up/down controller 510, the resistance value of the resistor string unit 540 is decreased by the switching operation of the resistor selection switching unit 530.

As illustrated in FIGS. 7A and 7B, the transient load switching signal Stran is outputted when the output voltage Vout in the transient state rises above the transient reference voltage Vref_tran having the second level, and the up/down controller 510 outputs the H-level up signal UP when the first calibration switching signal Scal is outputted because the output voltage Vout becomes lower than the calibration reference voltage Vref_cal, which has the third level that is lower than the first and second levels.

Figure 7C:
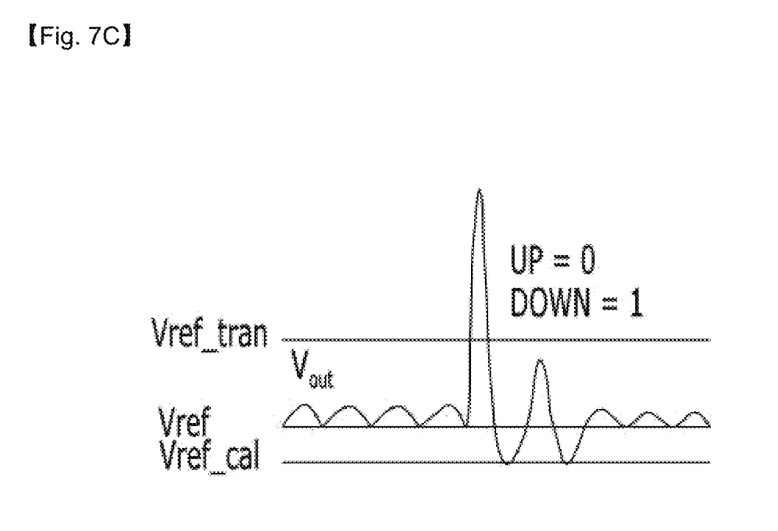

When the second calibration switching signal Scal is outputted because the output voltage Vout becomes lower than the calibration reference voltage Vref_cal once again as illustrated in FIG. 7C, the up/down controller 510 outputs the H-level down signal DOWN.

As shown in FIG. 7B, when the output voltage Vout becomes higher than the calibration reference voltage Vref_cal after the first calibration switching signal Scal is outputted, the up/down controller 510 still outputs the H-level up signal UP because the second calibration switching signal Scal is not generated.

Figure 8:
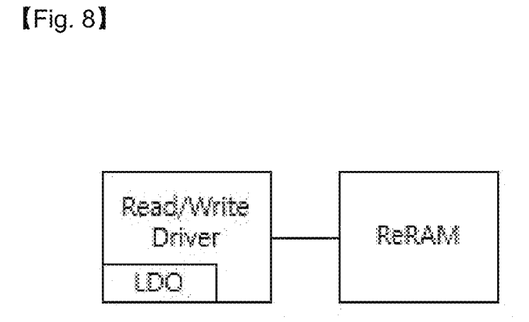
FIG. 8 is a schematic block diagram illustrating an example of a resistive memory device that includes a read/write driver using the digital LDO regulator according to the embodiment.

The digital LDO regulator according to the present embodiment may be included in a read/write driver of a resistive memory device as shown FIG. 8.

The resistive memory device according to the present embodiment basically includes an access element and a resistance element, and stores a data of "0" or "1" depending on a state of the resistance element.

A type of the resistive memory device may be decided according to a material of a variable resistance element that is electrically coupled to a drain pattern in the resistance memory device. For example, the variable resistance element may be formed of a resistive material or a PCMO film in the case of ReRAM, formed of a chalcogenide film in the case of PCRAM, formed of a magnetic layer of a magnetizable material in the case of MRAM, and formed of a magnetic switching element layer of a magnetizable material in the case of STTRAM.

According to the embodiments, the digital LDO regulator and the resistive memory device using the same can employ the push-pull scheme to rapidly respond to a variation of a peak load current, thereby improving a transient characteristic. Furthermore, the digital LDO regulator and the resistive memory device using the same can include the calibration circuit and adjust a recovery speed of the load current in response to a characteristic change of a resistive memory cell.

Although various embodiments have been described for illustrative purposes, it will be apparent to those skilled in the art that various changes and modifications may be made without departing from the spirit and scope of the invention as defined in the following claims.

What is claimed is:

1. A digital LDO (Low Drop-Out) regulator, comprising:
a reference voltage comparison circuit configured to compare an output voltage to a reference voltage having a first level, and to output a reference load switching signal when the output voltage rises above the reference voltage;
a push-pull logic circuit configured to output a control current in a push-pull manner in response to the reference load switching signal;
a transient load voltage comparison circuit configured to compare the output voltage to a transient reference voltage having a second level, and to output a transient load switching signal when the output voltage rises above the transient reference voltage;
a transient current switching circuit configured to perform a switching operation in response to the transient load switching signal, the switching operation controlling the push-pull logic circuit to pass a transient current;
a current mirroring circuit configured to provide a mirroring current to the push-pull logic circuit after a transient state;
a load current supply circuit configured to switch in response to the control current outputted from the push-pull logic circuit, and to supply a load current; and
a capacitor coupled in parallel to a control terminal of the load current supply circuit.

2. The digital LDO regulator of claim 1, further comprising a current calibration circuit positioned between the push-pull logic circuit and the current mirroring circuit and configured to calibrate the mirroring current flowing through the push-pull logic circuit.

3. The digital LDO regulator of claim 2, wherein the current mirroring circuit comprises:
a first-type transistor coupled to a supply voltage terminal and configured to generate a push-type mirror current;
a first current source positioned between the first-type transistor and a ground voltage terminal;
a second-type transistor coupled to the ground voltage terminal and configured to generate a pull-type mirror current; and
a second current source positioned between the second-type transistor and the supply voltage terminal.

4. The digital LDO regulator of claim 3, wherein the push-pull logic circuit comprises:
a push transistor coupled to the supply voltage terminal and configured to output a push control current;
a pull transistor coupled to the ground voltage terminal and configured to output a pull control current;
a first switching element positioned between the push transistor and the control terminal of the load current supply circuit, and configured to supply the push control current to the load current supply circuit as the control current; and
a second switching element positioned between the pull transistor and the control terminal of the load current supply circuit, and configured to supply the pull control current to the load current supply circuit as the control current.

5. The digital LDO regulator of claim 4, wherein the transient current switching circuit comprises:
an upper control switch being turned on in response to the transient load switching signal and controlling a gate voltage of the push transistor such that the transient current flows to the push transistor; and
a lower control switch being turned on in response to the transient load switching signal and controlling a gate voltage of the pull transistor such that the transient current flows to the pull transistor.

6. The digital LDO regulator of claim 2, wherein the current calibration circuit comprises:
an up/down controller configured to compare the output voltage to a calibration reference voltage having a third level, and to output an up signal or a down signal using the transient load switching signal and a calibration switching signal, the calibration switching signal being outputted when the output voltage becomes lower than the calibration reference voltage;
an up/down counter configured to output an up count signal or a down count signal in response to the up signal or the down signal, respectively;
a resistor string unit positioned between the push-pull logic circuit and the current mirroring circuit, the resistor string unit comprising a plurality of resistors being coupled in series to each other and having different sizes; and
a resistor selection switching unit configured to perform a switching operation to select one or more resistors among the plurality of resistors in the resistor string unit in response to the up count signal or the down count signal.

7. The digital LDO regulator of claim 6, wherein the up/down controller outputs the up signal when a first calibration switching signal is outputted as the output voltage becomes lower than the calibration reference voltage, and outputs the down signal when a second calibration switching signal is outputted as the output voltage becomes lower than the calibration reference voltage once again after the first calibration switching signal is outputted.

8. The digital LDO regulator of claim 6, wherein the up/down controller comprises:
a calibration voltage comparator configured to compare the output voltage and the calibration reference voltage, and to output the calibration switching signal when the output voltage becomes lower than the calibration reference voltage;
a first D flip-flop (F/F) configured to receive a supply voltage, and to output a first level signal when the transient load switching signal is input to the first D F/F;
a second D F/F configured to receive the first level signal from the first D F/F, and to output the up signal having a first level using the calibration switching signal as a clock signal;
a third D F/F configured to receive the up signal having the first level from the second D F/F, and to output the down signal having the first level using the calibration switching signal as a clock signal; and
a prohibitor configured to shift the first-level up signal to a second level while the first-level down signal is outputted from the third D F/F after the first-level up signal is outputted from the second D F/F.

9. The digital LDO regulator of claim 6, wherein the transient reference voltage is higher than the reference voltage.

10. The digital LDO regulator of claim 6, wherein the calibration reference voltage is lower than the reference voltage.

11. The digital LDO regulator of claim 6, wherein when the up signal is outputted from the up/down controller, a resistance value of the resistor string unit is increased according to an operation of the resistor selection switching unit, and wherein when the down signal is outputted from the up/down controller, the resistance value of the resistor string unit is decreased according to the operation of the resistor selection switching unit.

12. A read/write driver including a digital LDO regulator, wherein the digital LDO regulator comprises:

a reference voltage comparison circuit configured to compare an output voltage to a reference voltage having a first level, and to output a reference load switching signal when the output voltage rises above the reference voltage;

a push-pull logic circuit configured to output a control current in a push-pull manner in response to the reference load switching signal;

a transient load voltage comparison circuit configured to compare the output voltage to a transient reference voltage having a second level, and to output a transient load switching signal when the output voltage rises above the transient reference voltage;

a transient current switching circuit configured to perform a switching operation in response to the transient load switching signal, the switching operation controlling the push-pull logic circuit to pass a transient current;

a current mirroring circuit configured to provide a mirroring current to the push-pull logic circuit after a transient state;

a load current supply circuit configured to switch in response to the control current outputted from the push-pull logic circuit, and to supply a load current; and a capacitor coupled in parallel to a control terminal of the load current supply circuit.

13. The read/write driver of claim 12, further comprising a current calibration circuit positioned between the push-pull logic circuit and the current mirroring circuit and configured to calibrate the mirroring current flowing through the push-pull logic circuit.

14. The read/write driver of claim 13, wherein the current calibration unit comprises:

an up/down controller configured to compare the output voltage to a calibration reference voltage having a third level, and to output an up signal or a down signal using the transient load switching signal and a calibration switching signal, the calibration switching signal being outputted when the output voltage becomes lower than the calibration reference voltage;

an up/down counter configured to output an up count signal or a down count signal in response to the up signal or the down signal, respectively;

a resistor string unit positioned between the push-pull logic circuit and the current mirroring circuit, the resistor string unit comprising a plurality of resistors being coupled in series to each other and having different sizes; and a resistor selection switching unit configured to perform a switching operation to select one or more resistors among the plurality of resistors in the resistor string unit in response to the up count signal or the down count signal.

15. The read/write driver of claim 14, wherein the transient reference voltage is higher than the reference voltage.

16. The read/write driver of claim 14, wherein the calibration reference voltage is lower than the reference voltage.

17. A resistive memory device comprising a read/write driver that includes a digital LDO regulator, wherein the digital LDO regulator comprises:

a reference voltage comparison circuit configured to compare an output voltage to a reference voltage having a first level, and to output a reference load switching signal when the output voltage rises above the reference voltage;

a push-pull logic circuit configured to output a control current in a push-pull manner in response to the reference load switching signal;

a transient load voltage comparison circuit configured to compare the output voltage to a transient reference voltage having a second level, and to output a transient load switching signal when the output voltage rises above the transient reference voltage;

a transient current switching circuit configured to perform a switching operation in response to the transient load switching signal, the switching operation controlling the push-pull logic circuit to pass a transient current;

a current mirroring circuit configured to provide a mirroring current to the push-pull logic circuit after a transient state;

a load current supply circuit configured to switch in response to the control current outputted from the push-pull logic circuit, and to supply a load current; and a capacitor coupled in parallel to a control terminal of the load current supply circuit.

18. The resistive memory device of claim 17, further comprising a current calibration circuit positioned between the push-pull logic circuit and the current mirroring circuit and configured to calibrate the mirroring current flowing through the push-pull logic circuit.

* * * * *